(12) United States Patent
Yon et al.

(10) Patent No.: US 10,175,670 B2
(45) Date of Patent: Jan. 8, 2019

(54) RESOURCE CONTROL SYSTEM WITH LOCAL REALLOCATION

(71) Applicant: Litecontrol Corporation, Hanson, MA (US)

(72) Inventors: Jeremy W. Yon, Plympton, MA (US); Jeremy W. Ogg, Plymouth, MA (US); Marc D. Pierce, Kingston, MA (US); Jean-Denis Wilnick, Taunton, MA (US); David W. Dranchak, Endwell, NY (US)

(73) Assignee: LITECONTROL CORPORATION, Hanson, MA (US)

( * ) Notice: Subject to any disclaimer, the term of this patent is extended or adjusted under 35 U.S.C. 154(b) by 28 days.

(21) Appl. No.: 15/359,052

(22) Filed: Nov. 22, 2016

(65) Prior Publication Data

US 2017/0123395 A1 May 4, 2017

Related U.S. Application Data

(63) Continuation of application No. 13/986,488, filed on May 8, 2013, now Pat. No. 9,506,962.

(51) Int. Cl.
*G06F 19/00* (2018.01)
*G05B 19/042* (2006.01)
(Continued)

(52) U.S. Cl.
CPC ......... *G05B 19/042* (2013.01); *G01R 21/133* (2013.01); *G06Q 10/06* (2013.01); *G06Q 50/06* (2013.01); *G05B 2219/2639* (2013.01)

(58) Field of Classification Search
CPC combination set(s) only.
See application file for complete search history.

(56) References Cited

U.S. PATENT DOCUMENTS 5,962,989 A   10/1999   Baker
6,122,603 A *  9/2000   Budike, Jr. ............ G01D 4/004
                                                  702/182
(Continued)

OTHER PUBLICATIONS

University of Iowa New Release, UI launches online dashboard to monitor energy consumption, Feb. 11, 2011; p. 1.*
(Continued)

*Primary Examiner* — Kidest Bahta
(74) *Attorney, Agent, or Firm* — Dority & Manning, P.A.

(57) ABSTRACT

Example aspects of the present disclosure allow an end user to determine how a finite amount of a measurable resource is allocated among the various balanceable and feature zones of control defined within the overall measurable resource control system, and which can be implemented using a wide variety of hardware/components. A control program allows the end user unprecedented flexibility and control to determine how the resource is allocated among the various zones or types of resource use within the application, as long as the total resource consumed does not exceed the predetermined/predefined total maximum allowable resource. When the end user adjusts a feature or balanceable zone level, the control program adjusts the other balanceable zones based on predefined algorithms, when necessary, to ensure that the maximum measurable resource consumed by the system does not exceed the predetermined/predefined overall maximum resource allocation.

12 Claims, 5 Drawing Sheets

(51) Int. Cl.
*G01R 21/133* (2006.01)
*G06Q 10/06* (2012.01)
*G06Q 50/06* (2012.01)

(56) References Cited

U.S. PATENT DOCUMENTS

| | | | |
|---|---|---|---|
| 7,163,156 B2 | 1/2007 | Kates | |
| 8,548,607 B1* | 10/2013 | Belz | G05B 15/02 |
| | | | 700/21 |
| 8,744,629 B2 | 6/2014 | Wallaert et al. | |
| 2004/0122930 A1* | 6/2004 | Pasternak | H04L 12/2803 |
| | | | 709/223 |
| 2006/0276938 A1 | 12/2006 | Miller | |
| 2007/0067062 A1 | 3/2007 | Mairs et al. | |
| 2009/0195349 A1* | 8/2009 | Frader-Thompson | |
| | | | G01D 4/002 |
| | | | 340/3.1 |
| 2010/0107109 A1 | 4/2010 | Filbeck et al. | |
| 2010/0286937 A1* | 11/2010 | Hedley | G06Q 30/02 |
| | | | 702/60 |
| 2012/0130513 A1 | 5/2012 | Hao et al. | |
| 2012/0221878 A1* | 8/2012 | Pocklington | G06F 1/3206 |
| | | | 713/340 |
| 2012/0296488 A1 | 11/2012 | Dharwada et al. | |
| 2012/0316808 A1* | 12/2012 | Frader-Thompson | |
| | | | G01D 4/002 |
| | | | 702/61 |
| 2013/0055132 A1* | 2/2013 | Foslien | G06F 17/30554 |
| | | | 715/771 |
| 2014/0232294 A1* | 8/2014 | Fredricks | H05B 37/0245 |
| | | | 315/297 |

OTHER PUBLICATIONS

Farmer et al., "Automated Energy Managment Integrating Green Technologies," National Conference on Undergraduate Research, Mar. 29-31, 2012, Ogden, Utah—8 pages.

* cited by examiner

RESOURCE CONTROL SYSTEM WITH LOCAL REALLOCATION

PRIORITY CLAIM

The present application is a continuation of U.S. application Ser. No. 13/986,488 having a filing date of May 8, 2013. Applicant claims priority to and benefit of all such applications and incorporate all such applications herein by reference.

FIELD OF THE INVENTION

The present invention relates to the control of measurable resources such as but not limited to power and further including lighting, and more particularly to allowing the local allocation of the measurable resource through adjustable zones of control while staying within a predetermined or predefined maximum measurable resource allocation.

BACKGROUND OF THE INVENTION

The control of measurable resources such as power, and in particular artificial light, is important for many reasons including ergonomic and ecological ones as well as energy and cost savings. Different approaches and control systems have been around for many years. A control system can be as simple as a single alternating current (AC) general purpose snap switch or as complex as centralized or decentralized overall energy management system. Complex integrated building management systems have their place by being able to offer advanced features such as internet and wireless access, utility interface for load shedding, messaging to issue maintenance alerts, and secure two-way communication to each device using a wide variety of communications methods such as low voltage control wiring, power line carrier communication, and any of a myriad of wireless connections.

A "specifier" typically is an engineer that determines which components in a system are used, how they are used, how they are interconnected, how much power both individual components and the overall system may draw, etc. A current trend in order to reduce or at least contain electrical energy costs, in particular for commercial properties, is to have a complex system or even a sophisticated computer or controller-based power control system potentially also tied directly into a utility. This trend leads specifiers to define a system with an increasingly higher level of control, which minimizes or eliminates the possibility of a person/user, for example in a space, an office or a laboratory (lab), having any input or influence on how the power including light sources, light levels, as well as other types of power usage.

Generally speaking, in an existing control system a specifier designing a lighting system with a plurality of zones of control would define the required lighting for a particular application (e.g., a space, a classroom, a lab, an office, an open office area, etc.), and also determine the maximum power allocated for the various types of lighting within the application (e.g., direct lighting, indirect lighting, task lighting, wail wash, plug load, etc.), with the sum of the amount of power allocated for each type being no more than the total power allowed for the particular application. Unfortunately, an end user is not allowed to increase the amount of power allocated to a particular zone beyond the amount initially allocated or defined by the specifier for the various types of lighting within the application even if it would make the work area more conducive to the particular user. Even if one or more particular zones were turned off, the power allocated for those zones would not be allowed to be reallocated to the remaining active/functional zones.

Therefore many times a user will not be allowed to get enough of a particular type of light in a particular zone to meet the user's needs/expectations (this may also be due to particular energy codes). For example, local, state, federal or client regulations commonly mandate a maximum wattage-per-square-foot for all of the lighting. The building design team is responsible for determining a division of this energy, often starting with critical, common areas such as circulation, building identification, and public spaces followed by the individual task areas of the workers. The trends are for the perpetual lowering of the overall wattage-per-square-foot. An example of where this becomes problematic is in a laboratory, where there is a large number of individual researchers with varying levels of lighting need based on varying levels of criticality of their experiments. Historical design guidelines were for an illuminance level of 100 footcandles on the workbenches, In contemporary design, because of the overall building limitations and shared-space needs of the building, it is more common to only be able to provide 50-70 footcandles or to intentionally not satisfy some of the shared building needs such as uncomfortably low lighting in corridors and support spaces.

It would be highly desirable to have a measurable resource control system with a plurality of zones that allowed a user the flexibility and control to adjust the level of a zone even to the maximum physically allowed for that particular zone as long as total power consumed remains within the overall/total maximum allowable limit and without impacting factors such as the safety of others.

It would also be desirable if the control system is applicable to any measurable resource and scalable as to the type and number of zones, and also scalable to be nested to allow multiple levels of a similar type of flexible control.

It also would be highly desirable to have a control system that provides functionality that meets the basic needs of the occupants, while meeting all required safety codes and regulations, such as but not limited to Underwriters Laboratories Inc. (UL) and the National Electrical Code (NEC), as well as industry standard requirements such as the Commission for High Performance Schools (CHPS) and the Leadership in Energy and Environmental Design (LEED) Green Building Rating System.

It is therefore an object of the invention to enhance the measurable resource, and especially the power and particularly lighting control art.

It is another object of the invention to provide a measurable resource control system comprising a plurality of zones that allows a user the flexibility and control to adjust the level of a zone even to the maximum physically allowed for that particular zone as long as total measurable resource consumed remains within the overall maximum allowable limit and without impacting factors such as the safety of others.

It is another object of the invention to provide a control system applicable to any measurable resource, scalable as to the type and number of zones, and also scalable enough to be nested to allow multiple levels of control.

It is yet another object of the invention to provide a control system solution that is easy to use, relatively simple to install, and can be implemented as the basis for a standalone system, or be implemented as a control program in a more complex management control system.

SUMMARY OF THE INVENTION

The invention provides a means for allowing an end user to determine how a finite amount of a measurable resource is allocated among the various balanceable and feature zones of control defined within the overall measurable resource control system, and which can be implemented using a wide variety of hardware/components, A control program allows the end user unprecedented flexibility and control to determine how the resource is allocated among the various zones or types of resource use within the application, as long as the total resource consumed does not exceed the predetermined/ predefined total maximum allowable resource. When the end user adjusts a feature or balanceable zone level, the control program adjusts the other balanceable zones based on predefined algorithms, when necessary, to ensure that the maximum measurable resource consumed by the system does not exceed the predetermined/predefined overall maximum resource allocation. The invention is scalable and can be infinitely nested.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Figure 1:
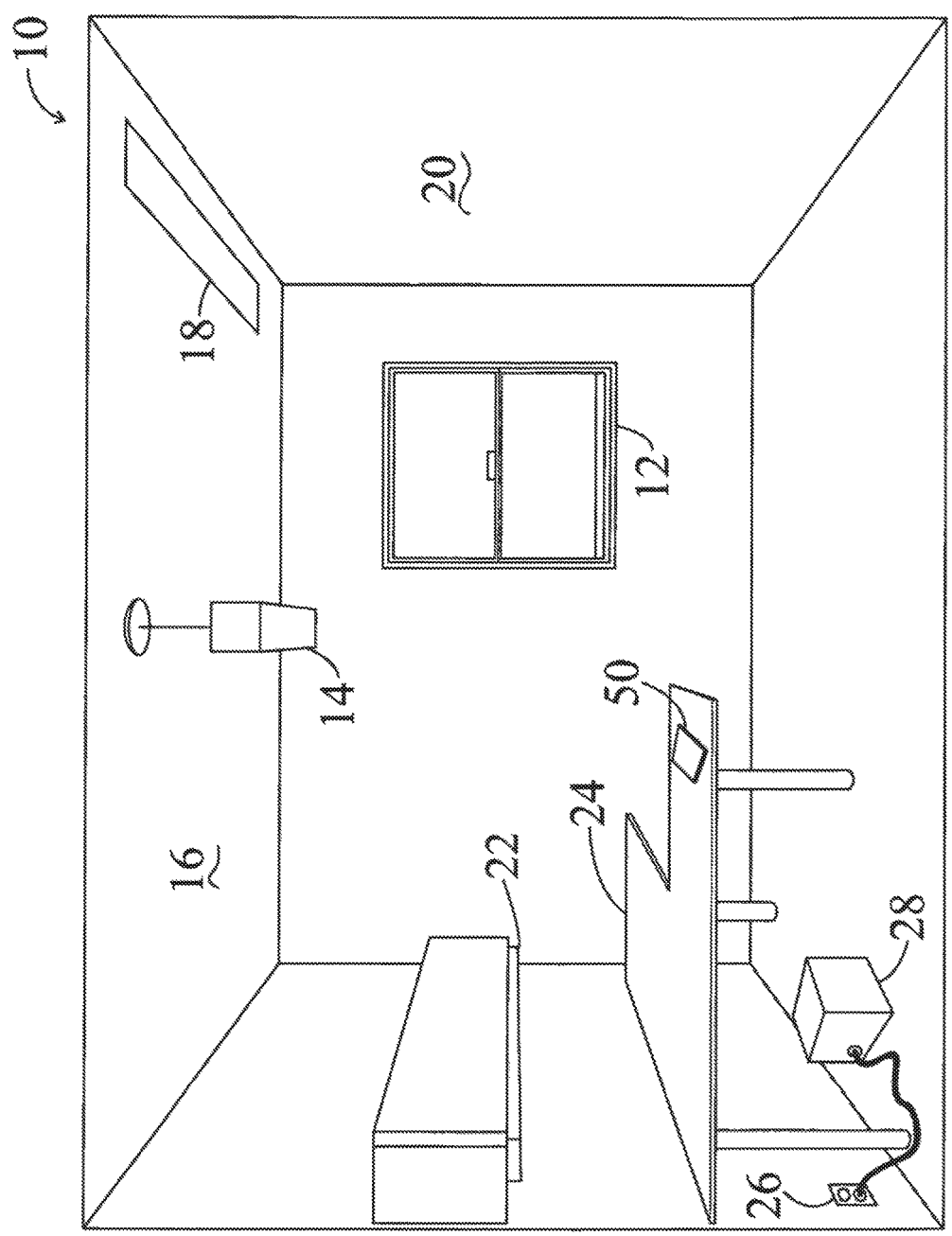
FIG. 1 is a perspective view of a space, which is representative of a private office and includes a plurality of zones of control under the control of a control program operating on a measurable resource control system in accordance with one embodiment of the present invention.

Generally speaking, the present invention provides a significant improvement in measurable resource control technology by providing a means for allowing an end user to determine how a finite amount of the measurable resource is allocated among the various balanceable and feature zones of control defined within the overall measurable resource control system, and which can be implemented using a wide variety of hardware/components.

A control program oversees and controls the allocation of the measurable resource for a plurality of zones of control or type of tasks, and even though the instant invention still has a specifier (or a default) determine/predefine the total maximum resource allowed for a particular overall application, in contrast to the prior art, the control program allows the end user unprecedented flexibility and control to determine how the resource is allocated among the various zones or types of resource use within the application, as long as the total resource consumed does not exceed the predetermined/ predefined total maximum allowable resource. When the end user adjusts one of the feature or balanceable zones, the control program adjusts the other balanceable zones based on predefined algorithms, when necessary, to ensure that the maximum measurable resource consumed by the system does not exceed the predetermined/predefined overall maximum resource allocation.

The invention is not only scalable as to the quantity and type of zones within an application, but any zone may comprise its own control system of zones, thereby allowing an infinite nesting of levels of zones with each level allowing an "end user" to reallocate resources while still staying within an overall resource allocation for that particular level.

It is beneficial to provide some definitions that include many of the elements and terms used in the descriptions in some of the various inventive embodiments disclosed hereinbelow to minimize redundancy.

It is especially beneficial to appropriately describe two types of control zones (or zones of control) used in the embodiments disclosed hereinbelow to minimize redundancy: they are feature zones and balanceable zones, with each of the zones associated with a particular task assigned to it within a particular control program, and with the feature zones resource requirements having priority over the resource requirements of the balanceable zones. A feature or "priority" zone is typically assigned a task with a higher priority or other need for specific control, for example, if the general task is the lighting for a particular space configuration (e.g., an office, a laboratory, a manufacturing floor, etc.), the primary light source for the space to ensure the overall safety of the occupant(s). In this instance, it may be desirable that the featured zone light level be maintained either at the predefined level, or adjustable by an end user but independently and without competition from the non-feature zones. In contradistinction, there may be other lighting tasks in that space that may be deemed less critical. If the specifier agrees that there is no reason that any of these particular less-critical tasks need to be treated as a feature zone, the end user is allowed the freedom to adjust the level(s) of these balanceable zones with the understanding that there is a predefined/predetermined maximum amount of power available, and to increase one of the zones may require reducing another balanceable zone(s) or possibly a feature zone depending on how the control program is configured. Although a feature zone has priority to a measurable resource over a balanceable zone, the amount of measurable resource a feature zone uses or is allocated is unrelated to its priority. In any case, the end user is given a "power allowance" in which he/she is allowed unprecedented freedom to adjust/reallocate as long as the total power consumption remains within the total power allowance, which the control program and control system ensures. In the case of multiple feature zones or multiple balanceable zones within an application, the particular system requirements will dictate the priority and resource allocation within each type of zone.

Lighting fixtures, often referred to as luminaires, are commonly used for illumination due to their ease of installation and their flexibility to be able to be configured to simultaneously provide many different combinations of direct and indirect light in a wide variety of form factors and optional features. While luminaires are available in many different form factors, and may provide illumination through many different types of power supplies and corresponding light sources, one particular example will be used to help describe the prior art examples as well as the various embodiments of the invention, since the specific quantity of luminaires, and the quantity of and specific light generating means within the luminaires is not critical to the invention.

The term "electrically powered light producing device" (EPLPD) as used herein is intended to generally describe some of the various devices that may comprise a lighting load used in the inventive control systems. These devices include but are not limited to incandescent lamps, self-ballasted lamps such as compact fluorescent or metal halogen lamps, strips of electroluminescent material energized by a power supply, light emitting diodes powered by a power supply, and a wide variety of fluorescent ballasts energized by electronic or magnetic ballasts. The devices and power supplies/ballasts do not necessarily require a luminaire or lighting fixture, but they may certainly benefit by the inclusion of the same. Since the instant invention requires the capability of being able increase or reduce the power consumption of a particular EPLPD preferably provides such means including but not limited to an analog or digital dimming interface, a uni- or bidirectional communications port, or an interface to a switching arrangement to facilitate the control of the devices.

For the systems and embodiments of the invention described hereinbelow, the power source delivers alternating current, the EPLPD in each luminaire is a plurality of linear fluorescent lamps, and the power supplies used to drive the lamps are AC-powered dimmable ballasts. It should be understood that the inventive control systems could just as easily be configured using a DC power source, light emitting diodes (LEDs) or strips of electroluminescent material for the light source, and a DC-input power supply to power the LEDs or strips of electroluminescent material. The inventive control system can be implemented using mixed lighting loads including incandescent lamps, self-ballasted lamps such as compact fluorescent or metal halogen lamps which may not even require a fixture, or any one of many other lighting components available to a person skilled in the art. In any case, it is assumed that the components used in the disclosed embodiments meet all required safety codes and regulations.

It should be understood by those skilled in the art that a measurable resource control system may, and typically does have many more components, some optional, some necessary, than those components identified and described in this as well as additional embodiments hereinbelow. For clarity, some components such as junction boxes, back boxes (boxes used to house and/or facilitate wiring to devices such as switches and occupancy sensors), conduit, and other miscellaneous parts, which are commonly found in a real-world installed control system are intentionally excluded from many figures, along with other parts, such as brackets, screws and nuts, lamp sockets, some power and lamp wires, decorative parts, ground connections, etc.

A load adjustment means (LAM), also referred to as a "slider", is used to adjust (increase or decrease) the level of a particular zone or a group of zones. Each LAM or slider may be implemented in many different ways depending on the application (e.g., a glass touchpad, a controller pad with tactile switches, such as but not limited to triac, a digital switch, a potentiometer, a 0-to-10 volt DC analog dimming device, and a touch-sensitive switch), although a touchpad or other software-based LAM or slider may be easier to implement.

Figure 2:
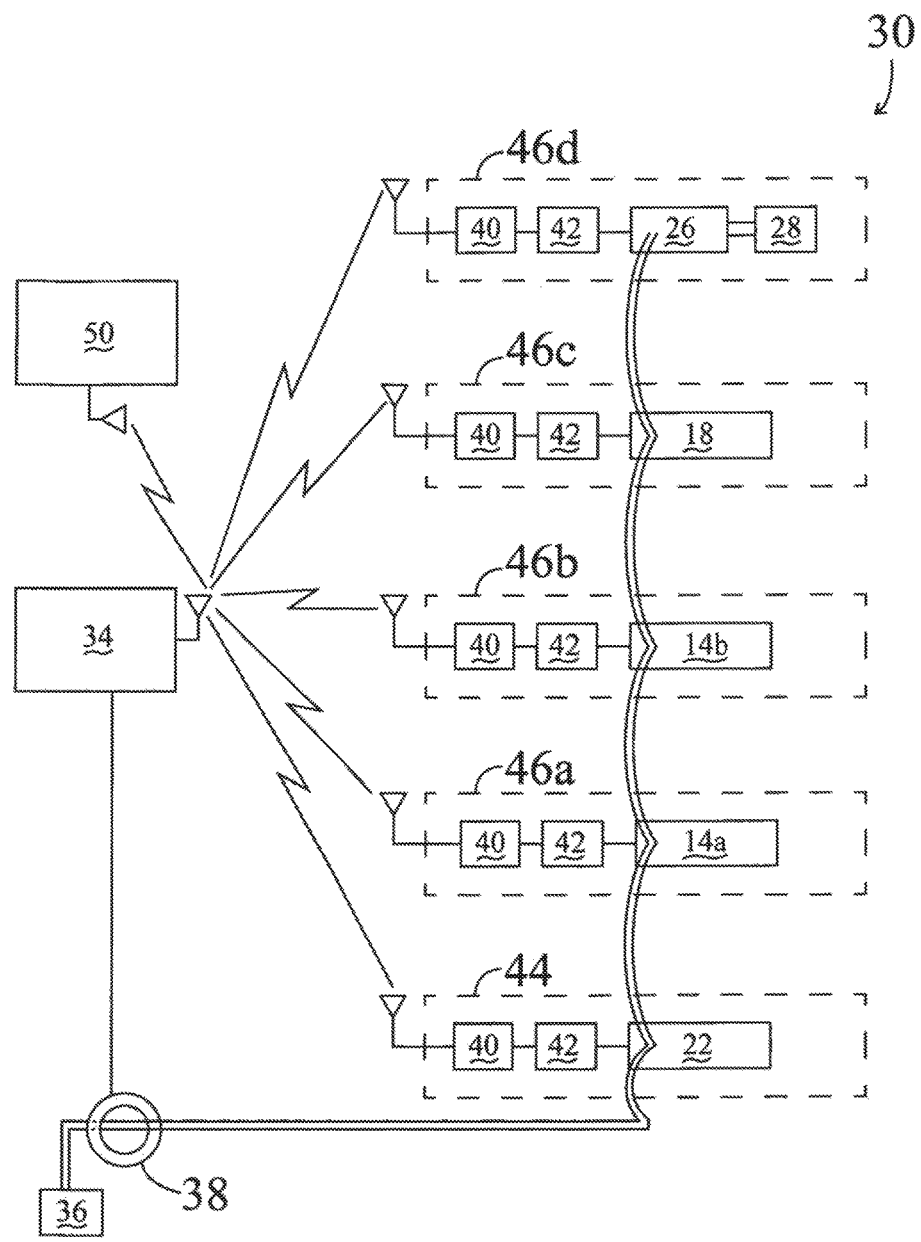
FIG. 2 is a schematic drawing of the control system showing how the zones of the control system receive an allocation of the power from a power source and how the zones communicate with a master/system control unit (MSCU) and how a user may interact through a user interface.
Figure 3:
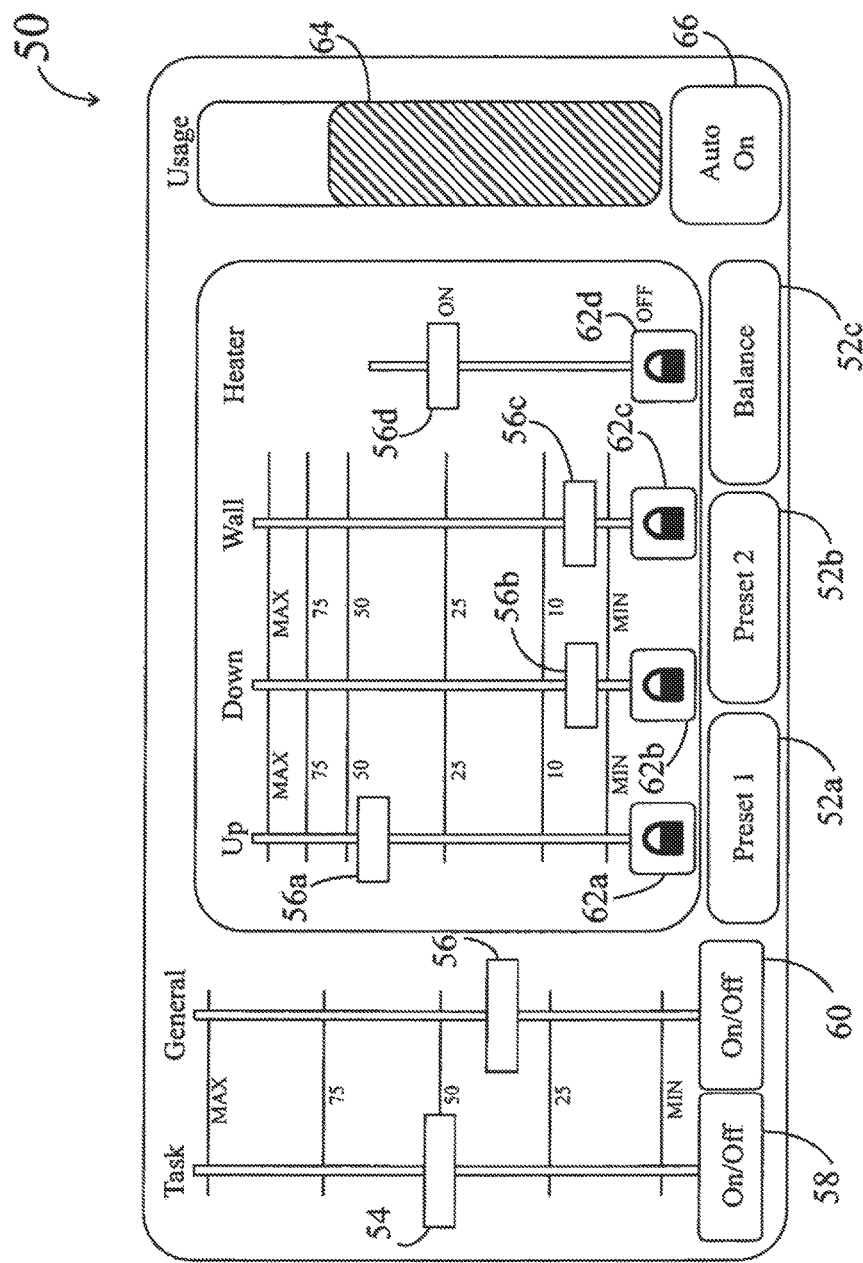
FIG. 3 is a front view of the user interface shown in FIGS. 1 and 2.

Referring now to FIGS. 1-3, all in accordance with a first embodiment of the present invention, but in particular to FIG. 1, there is shown a perspective view of a space 10, which is representative of a private office and comprises a window 12, a feature zone 44 further comprising a light source 22 to provide task illumination for a desktop 24, a first balanceable zone 46a further comprising a light source 14a for uplighting a ceiling 16, a second balanceable zone 46b further comprising a light source 14b to provide downlighting for space 10, a third balanceable zone 46c comprising a light source 18 to light a wall 20, and a fourth balanceable zone 46d comprising a power outlet 26 to provide power to a pluggable device such as a space heater 28. The energy to power the above mentioned zones 44 and 46a-46d in space 10 is controlled by a control system 30 (see FIG. 2) and the means for an end user to adjust the power to the various zones 44 and 46a-46d of system 30 in space 10 is through a user interface 50. Control system 30 allows an end user unprecedented flexibility and control to determine how the power is allocated among the various zones or types of measurable resource-consuming lighting devices within the application, as long as the total power consumed does not exceed the predetermined/predefined total maximum allowable power, and the control program adjusts the various balanceable zones based on predefined algorithms (including adaptive ones) to ensure that the maximum power allocation is not exceeded. The term "light source" is used to generally describe any viable lighting option suitable for a particular application and it may also include any luminaire or EPLPD as described hereinabove, and any housing or other applicable items.

Referring now particularly to FIG. 2, there is shown a schematic drawing of control system 30 showing how zones 44 and 46a-46d receive an allocation of the power from a power source 36 and how zone 44 and 46a-46d communicate with a master/system control unit (MSCU) 34 and a user interacts through user interface 50. MSCU 34 comprises a control program 35 (only the user interface 50 is shown) comprising computer code executable on MSCU 34 to control feature zone 44 and balanceable zones 46a-46d. MSCU 34 may be self-powered (e.g., battery, solar, etc.), powered by power source 36, or any other available source of power.

MSCU 34 in this embodiment also comprises the communications capability necessary to wirelessly communicate with user interface 50 and with a plurality of receivers 40, and even to communicate with other MSCUs in other control systems (not shown in this embodiment). Each receiver 40 is also connected to a control interface 42 appropriate for the device(s) in each particular zone 44 and 46a-46d through any of myriad methods including but not limited to low voltage control wiring, power line carrier communication, optical communications and any of a myriad of wireless connections using an appropriate protocol(s) and one-or two-way communication. Some representative protocols are: an industry standard 0-to-10 volt DC analog dimming interface; and DALI®, Lonworks®, Ethernet and CEBus® digital interfaces. DALI® stands for Digital Addressable Lighting Interface and is a protocol set out in the technical standard IEC 62386 and is either a trademark or registered trademark of ZVEI—Zentralverband Elektrotechnik—; und Elektronikindustrie e.V. Eingetragener Verein in the United States and/or other countries. Lonworks® is a trademark of Echelon Corporation of Palo Alto, Calif., and CEBus® is a trademark of the Electronic Industries Association. It should be apparent to those skilled in the art that the means of communication between MSCU 34 and receivers 40, and between MSCUs may also be through other communications modalities without departing, from the true spirit of the invention.

In this particular embodiment light sources 14*a* and 14*b* of respective balanceable zones 46*a*-46*b* each use the 0-10 volt DC analog dimming interface to set the light level of each zone and corresponding relays (not shown) to provide additional functionality such as the ability to turn off light sources 14*a* and 14*b*. Light source 18 of balanceable zone 46*c* uses the DALI® digital interface to set the light level of this zone, and balanceable zone 46*d* uses a contact-closure analog interface to control power outlet 26.

Zones 44 and 46*a*-46*d* are shown as being represented schematically within dashed boxes and each zone include a respective receiver 40 and control interface 42 within the box. The actual components within a box representing a zone are contextually dependent, and instead of limiting the invention, represent the flexibility and infinite configurability of the inventive control system 30. It should also be apparent to those skilled in the art that other devices, communications modalities, protocols, etc. known or yet to be devised could be substituted for or added to those chosen for purposes of disclosure without departing from the true spirit of the invention.

The accuracy of the actual power used by system 30 can be enhanced by the inclusion at least one instance of power monitoring means 38 to monitor and limit the overall power being consumed by system 30, but preferably additional power monitoring means (not shown) may be strategically placed to best accomplish specific needs/requirements for higher accuracy (e.g., monitoring power consumption in one or more zones or in a portion thereof). While there are many different ways to monitor the total power usage, one way is to provide monitoring means 38 on the power source 36 to system 30 that generates a signal representative of the power consumed that is compared by MSCU 34 to the pre-programmed/pre-defined maximum allocation(s) of power. Monitoring means 38 may also be implemented in one or more ways including but not limited to a direct electrical monitoring sensor, an indirect monitoring sensor (e.g., an occupancy sensor, a daylight harvesting sensor, and a proximity sensor), a computerized look-up table of programmed events or occurrences, and zone sensing (e.g., thermal, optical, or electrical measurements). Monitoring means 38 could even be incorporated into one or more of the devices that comprise zones 44 and 46*a*-46*d*. Control system 30 could optionally include power limiting means or power disconnect (neither shown), preferably located between power source 36 and zones 44 and 46*a*-46*d*, as one way to ensure that the maximum amount of power drawn by zones 44 and 46*a*-46*d* from power source 36 never exceeds the preallowed/predefined maximum allocation.

Control program 35 of control system 30 allows many different functions and operations to be executed (some of which are described hereinbelow), although the primary function is to provide control zones 44 and 46*a*-46*d* with a set of default or initial values, and to allow an end user through the use of user interface 50 to control how much of the maximum total power allowed is allocated between feature zone slider 54 and a general slider 56 (i.e., the sum of balanceable zone sliders 56*a*-56*d*). The end user may then also adjust the relative power allocation among of each of balanceable zone sliders 56*a*-56*d*. The previous two steps could also be reversed or even iteratively adjusted until the "ideal" power balance is achieved to the user's satisfaction while the control program 35 ensures that the total power used never exceeds the preallowed/predefined maximum.

Depending on the particular control system's requirements, the computing ability of MSCU 34 could also be implemented in many different ways other than as a stand-alone processor, including but not limited to being part of a distributed computing system (e.g., cloud computing or tied to other MSCUs), and being just a small portion of a complex integrated building management system, which can offer advanced features such as internet and wireless access, utility interface for load shedding, messaging to issue maintenance alerts, and secure two-way communication to each device using a wide variety of communications methods such as low voltage control wiring, power line carrier communication, optical communications and any of a myriad of wireless connections. Communications capability could even be external from and attached to a MSCU, thus allowing almost any computing device with enough processing power and a communications port to potentially function as a MSCU.

While the invention is disclosed as a complete measurable resource control system including hardware, it also can be implemented as a control program that is run on even just a portion of a control system that includes the necessary/appropriate hardware and communication capability.

The inventive measurable resource control system 30 may be implemented in myriad of zones configurations, with the configurations with least numbers of zones being: a) one feature zone and one balanceable zone, and b) two balanceable zones. Systems with more zones can then be built up from either of these two configurations.

While the inventive control system 30 includes a plurality of feature zones 44 and balanceable zones 46-46*d*, it should be understood that there may be other types of zones even yet to be invented that may add to the versatility of control system 30 without departing from the spirit of the invention. Also since there are four balanceable zones 46*a*-46*d*, they are deemed to have equal priority in this embodiment, but it is well within the invention that the four zones may be weighted non-uniformly. These types of decisions truly are application dependent and only add to the versatility of the invention.

Referring now particularly to FIG. 3, there is shown a front view of the user interface 50, which is implemented as a touchpanel in this embodiment, but it could also have been implemented as a panel with electrical buttons, a computer screen and pointing device, an application operating on a cell phone, or myriad other wired and/or wireless devices that offer similar functionality. User interface 50 in this embodiment communicates bidirectionally through wireless communication means (although wired communications could also have been chosen) to MSCU 34 to convey the status of control zones 44 and 46*a*-46*d* to the end user and allows the end user to communicate to MSCU 34 any changes the end user wishes to make to the current settings of zones 44 and 46*a*-46*d* by operating corresponding sliders 54, 56, and 56*a*-56*d*.

While there is only one user interface 50 shown in this embodiment, it should be understood that there may be multiple user interfaces, either within or even outside of space 10 if the application warranted. Also if MSCU 34 is implemented on a laptop computer, for example, user interface 50 could be implemented on the video screen of the laptop computer. User interface 50 may further include features or characteristics, even ones yet to be invented, such as but not limited to being a self-learning heuristic device that may add to the versatility and functionality of control system 30.

Feature zone slider 54 is allowed to be operated at any desired level by the end user, but the higher level that feature zone slider 54 is adjusted, there is less power available for balanceable zone sliders 56*a*-56*d*. Balanceable zones sliders 56a-56d are controlled by general slider 56, which represents the sum of the power allocated to balanceable zones sliders 56a-56d.

User interface 50 in this embodiment also comprises three "scenes": balanced 52a, preset 1 52b, and preset 2 52c. Balanced 52a is the factory setting that evenly distributed power among balanceable zones 46a-46d. Preset 1 52b and preset 2 52c are user-configurable by a touch-and-hold process. Preset 1 52a and Preset 2 52b set the levels of the six sliders, (54, 56, and 56-56d). Both feature slider 54 and general slider 56 each have a respective on/off switch 58 and 60, and the level of neither of them is affected by adjusting balanceable zone sliders 56a-56d.

Balanceable zones sliders 56a-46d are linked together to show percentage balance of available power as set by general slider 56. Each balanceable zone slider 56a-56d has a lock button 62a-62d to lock in the particular zone at the current level and preclude it from further balancing or adjusting.

Usage indicator 64 in this embodiment is graphically implemented as a "bar" representing the available system power and a shaded bar to show the current usage. Other possible options include showing actual power savings in addition to relative saving shown by usage indicator 64.

Auto On indicator 66 in this embodiment is implemented having three rotatable positions: Off, Zones On, and All On, with each position alternately activated by a push or click of Auto On indicator 66. In the "off" position, when lowering any individual one of zones sliders 56a-56d, none of the other balanceable zones sliders automatically increase. In the "Zones On" position, feature zone slider 54 and general 56 slider do not automatically raise, but individual balanceable zones sliders 56a-56d automatically balance, using all of the available power as limited by general slider 56. In the "All On" position, maximum power is used across all zone sliders.

In this embodiment, if the user sets sliders 54, 56, and 56a-56d of each respective zone 44, 46, and 46a-46d on user interface 50 to the maximum level, control program 35 is programmed to reduced the value of slider 56 as much as necessary, and to allocate 25 percent of the maximum allowable power for slider 56 to each slider 56a-56d representing the corresponding adjustable zones 46a-46d and their associated circuits and devices. It should be apparent to those skilled in the art that the function, and inclusion or exclusion of the various functions described hereinabove for user interface 50 may differ from the functions in the disclosed embodiment without departing from the true spirit of the invention.

The inclusion of sensors, such as for occupancy, daylight harvesting are not shown, but be incorporated into control system 30 to further improve the system's capability and efficiency. A typical occupancy sensor commonly requires an external power unit (not shown), and daylight harvesting sensors are typically connected through a 0-10V DC analog interface and may therefore be easily incorporated into one of the existing control interfaces 42 as is shown in connection to zones 46a-46c in this embodiment.

The implementation of control system 30 can provide an additional benefit to the specifier and owner. Previously, a specifier was required to choose the size/capacity of equipment and components such as transformer rating, building service size, building distribution wiring gauge, etc., to safely accommodate a worst-case situation of the maximum power that the sum or all devices could draw/consume. Similar to the discussion hereinabove regarding dividing up the available watts-per-square-foot for lighting power, there is a singular amount of total power that a building can draw, and all supporting equipment must be increased to accommodate this theoretical maximum. System 30 may instead limit the potential worst-case total-power and enable the use of smaller electrical equipment saving cost, materials, and space required when system 30 is implemented with distributed fail-safe devices such as circuit breakers or fuses to prevent an overload condition. This aspect of the instant invention also addresses a separate problem of less physical space being allocated in building design for electrical equipment. Lowering the capacity requirements of the electrical equipment/components also typically results in a smaller physical size/volume which can more readily fit into a smaller room.

The embodiment disclosed in control system 30 shows an application based on a single space 10, but it should be apparent to those skilled in the art that this invention is scalable or "nested" both downward, to include multiple systems within a space, but also upward. So for example, at the next level each zone could represent a space similar to space 10, etc., and even have its own control system. This could be extendible not only to the power producers (i.e., the power producing utilities), but also be applicable to any measurable resource including but not limited to electrical power, water, oil, natural gas, and steam.

Figure 4:
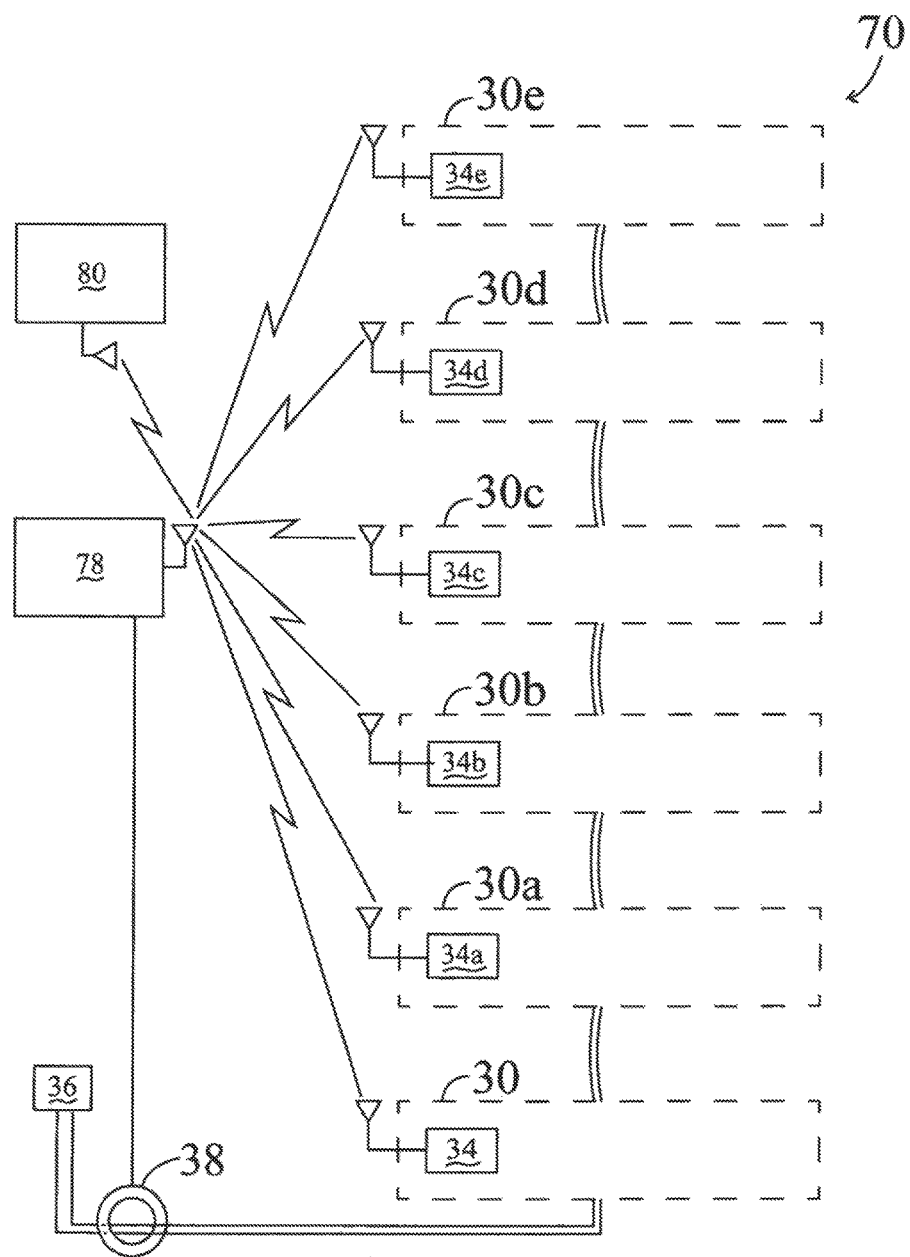
FIG. 4 is a schematic drawing of a control system in accordance with an extension of the embodiment of FIGS. 1-3 that demonstrates how the inventive control system can be "nested" (i.e., to place a routine inside another routine that is at a higher hierarchical level) to allow a user at either a higher level a similar unprecedented level of flexibility and control over how the measurable resource is allocated among the various zones and levels.
Figure 5:
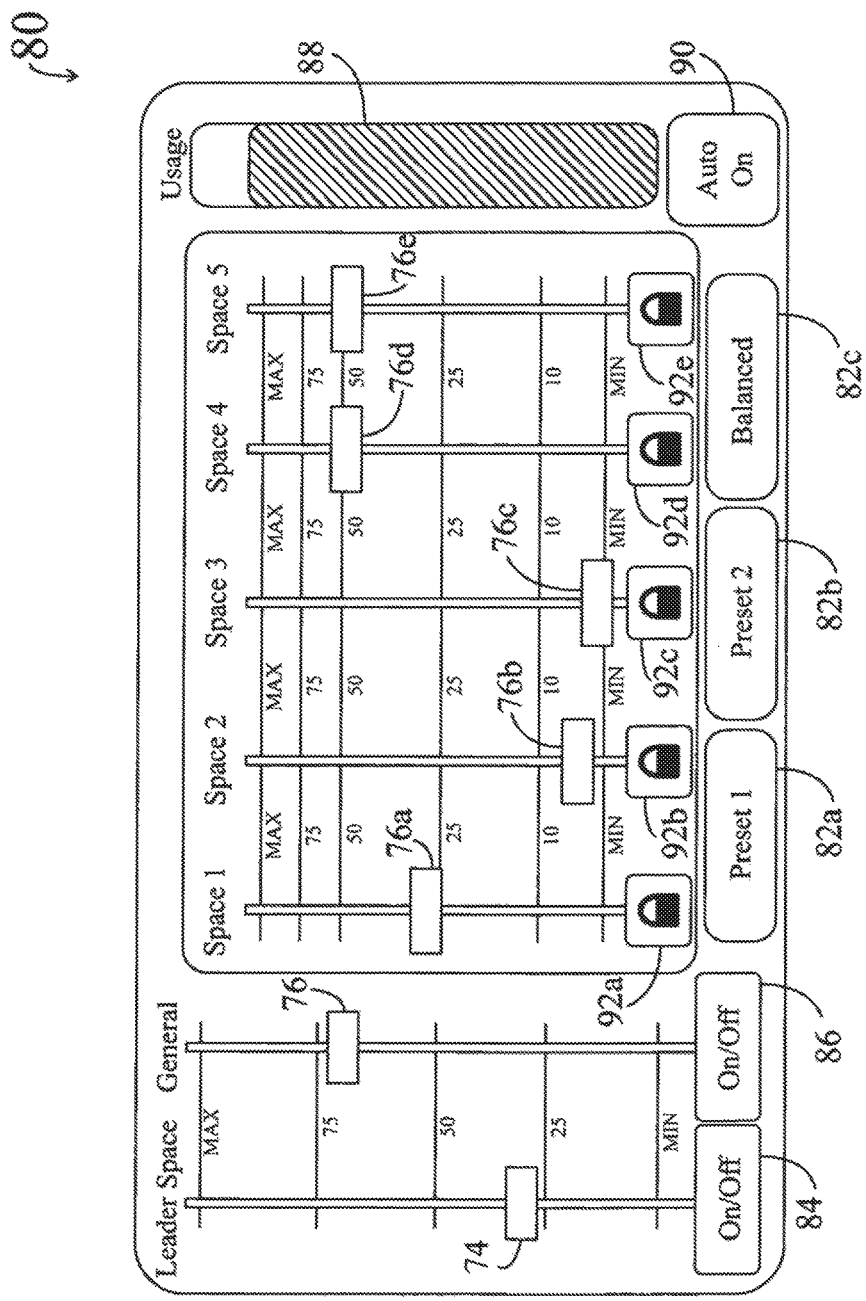
FIG. 5 is a front view of the user interface shown in FIG. 4.

Referring now to FIGS. 4 and 5, there is shown a control system 70, an extension of control system 30, that demonstrates how the inventive control system 30 may be "nested" (i.e., to place a routine inside another routine that is at a higher hierarchical level) to allow a user at either a higher level or even a lower level a similar unprecedented level of flexibility and control to determine how the measurable resource is allocated among the various zones or types of resource use within an application, as long as the total resource consumed does not exceed the predetermined/predefined total maximum allowable resource, and the control program 70 adjusts the various balanceable zones based on predefined algorithms to ensure that the maximum resource allocation is not exceeded. Control system 70 comprises a user interface 80 that is very similar to user interface 50 from many points of view. Therefore for the most part only the differences will be discussed hereinbelow.

In this embodiment, zone sliders 74 and 76a-76e on user interface 80 each represent a private space as described hereinabove with slider 74 representing control system 30 in space 10 (see FIG. 1) of a project leader, thus earning space 10 a designation as a feature zone, while sliders 76a-76e represent respective control systems 30a-30e operating on respective MSCUs 34a-34e in spaces 72a-72e (not shown) of other members of the project, thus earning control systems 30a-30e in respective spaces 72a-72e a designation as balanceable zones. Only MSCUs 34 and 34a-34e are shown in respective control systems 30 and 30a-30e in FIG. 4 for purposes of clarity and since MSCUs 34 and 34a-34e have inter-MSCU communications capability, and it should be understood that each control system in this embodiment has a full complement of components as control system 30 shows in FIG. 2. It should be obvious how this nesting concept can be further applied to a control system for a plurality of projects, or grouping by floor, or building, or by any other grouping. User interface 80 may be placed in one of abovementioned spaces 10 and/or 72a-72e, or it may be placed in a different location, such as the space (not shown) of a person all members report to. Elements 82a-92e are shown in FIG. 5 but no additional description is included since these elements function similarly to their counterparts in user interface 50 (see FIG. 3).

Since MSCU 34 in system 30 already includes the capability to communicate to other MSCUs, and since each control systems 30 and 30a-30e already includes a power monitor 38, control system 70 is already equipped with at least the minimum hardware necessary to properly function. Control program 70a of control system 70 can operate on a standalone MSCU 78 or it can be installed on a portion of one of the other MSCUs 34 and 34a-34e, since the MSCUs already have the capability of communicating with one another. Additional power monitoring means 38 to monitor and limit the overall power being consumed by system 70 is included, but may not be needed if the accuracy of the power monitoring already included in control systems 30 and 30a-30e is deemed adequate.

It should be apparent to one skilled in the art of how control program 70a of control system 70 allows a higher-level end user unprecedented flexibility and control to determine how the power is allocated among the various spaces 10 and 72a-72e within the application, as long as the total resource consumed does not exceed the predetermined/predefined total maximum allowable resource at this higher level.

While the disclosed embodiments are based on the distribution and control of electricity (i.e., electrical power), which is transportable through a network of wires, the inventive control system may also be applied to the control of other transportable measurable resources such as but not limited to water, steam, oil and natural gas. For example, in the case of water, it is transportable through a network of pipes and the volume of water flowing to any particular zone can be measured by a remotely monitored flow meter, and preferably controlled by remotely controllable valves. It should be apparent to those skilled in the art how analogous a control system based on water is to the embodiments disclosed hereinabove. Furthermore, while the disclosed embodiments each show allocation of a single measurable resource, it should be understood that a system, having the capability of allocating, independently or dependently, two or more different measurable resources, can be constructed using the novel principles of the instant invention. Consequently, such systems are deemed to be within the scope of the instant invention.

Since other modifications and changes varied to fit particular operating requirements and environments will be apparent to those skilled in the art, this invention is not considered limited to the representative examples chosen for purposes of this disclosure, and covers all changes and modifications which do not constitute departures from the true spirit and scope of this invention.

Having thus described the invention, what is desired to be protected by Letters Patent is presented in the subsequently appended claims.

What is claimed is:

1. A control system for controlling allocation of power in a lighting system, the control system comprising:
    a first control interface configured to control operation of at least one first light source in a feature zone;
    a plurality of second control interfaces, each second control interface associated with one of a plurality of balanceable zones, each second control interface configured to control operation of at least one second light source in its associated balanceable zone, at least one of the second control interfaces comprising a second control system nested within the control system;
    a power monitor configured to monitor an overall power consumption by the at least one first light source in the feature zone and the at least one second light source in each of the plurality of balanceable zones;
    a master control unit in communication with the first control interface and the plurality of second control interfaces, the master control unit configured to execute a control program to allocate power among the feature zone and the plurality of balanceable zones based at least in part on the overall power consumption such that when the overall power consumption is at an allowable limit, an increase in power consumption by one of the plurality of balanceable zones results in a decrease in power consumption by another of the plurality of balanceable zones without affecting power consumption by the feature zone.

2. The control system of claim 1, wherein the second control system comprises:
    a third control interface configured to control operation of at least one light source in a second feature zone;
    a plurality of fourth control interfaces, each fourth control interface associated with one of a plurality of second balanceable zones, each fourth control interface configured to control operation of at least one light source in its associated second balanceable zone;
    a power monitor configured to monitor an overall power consumption by the at least one light source in the second feature zone and the at least one light source in each of the plurality of second balanceable zones;
    a master control unit in communication with the third control interface and the plurality of fourth control interfaces, the master control unit configured to execute a control program to allocate power among the second feature zone and the plurality of second balanceable zones based at least in part on the overall power consumption such that when the overall power consumption is at an allowable limit, an increase in power consumption by one of the plurality of second balanceable zones results in a decrease in power consumption by another of the plurality of second balanceable zones without affecting power consumption by the second feature zone.

3. The control system of claim 2, wherein the master control unit is configured to execute a control program to independently control power consumption of the feature zone without competition from the plurality of balanceable zones.

4. The control system of claim 1, wherein the master control unit is in communication with a user interface.

5. The control system of claim 1, wherein the user interface comprises a feature zone load adjustment mechanism associated with the feature zone, a general load adjustment mechanism, and a balanceable zone load adjustment mechanism associated with each of the plurality of balanceable zones.

6. The control system of claim 5, wherein the general load adjustment mechanism is configured to control a total power provided to the plurality of balanceable zones.

7. The control system of claim 6, wherein the master control unit is configured to execute a control program to receive a request for an increase in power consumption by the feature zone via the feature zone load adjustment mechanism and in response to the request, to adjust the general load adjustment mechanism such that an overall power consumption does not exceed the allowable limit.

8. The control system of claim 7, wherein the master control unit is configured to adjust a power consumption by one or more of the balanceable zones based at least in part the general load adjustment mechanism.

9. The control system of claim 7, wherein one or more of the feature zone load adjustment mechanism, the general load adjustment mechanism, and the balanceable zone load adjustment mechanism associated with each of the plurality of balanceable zones comprises a slider.

10. The control system of claim 1, wherein the at least one first light source is a primary light source for the space.

11. The control system of claim 1, wherein one or more of the feature zone or the plurality of balanceable zones is lockable.

12. The control system of claim 1, wherein the power monitor is configured to monitor power delivered by a power source to the at least one first light source in the feature zone and the at least one second light source in each of the plurality of balanceable zones.

\* \* \* \* \*